US011374188B2

(12) United States Patent
Korivi et al.

(10) Patent No.: US 11,374,188 B2
(45) Date of Patent: Jun. 28, 2022

(54) PHOTOVOLTAIC CELLS BASED ON DONOR AND ACCEPTOR NANO-PARTICULATE CONJUGATES IN CONDUCTIVE POLYMER BLENDS

(71) Applicant: Tuskegee University, Tuskegee, AL (US)

(72) Inventors: Naga Korivi, Tuskegee, AL (US); Kalyan Das, Tuskegee, AL (US)

(73) Assignee: Tuskegee University, Tuskegee, AL (US)

(*) Notice: Subject to any disclaimer, the term of this patent is extended or adjusted under 35 U.S.C. 154(b) by 0 days.

(21) Appl. No.: 16/704,876

(22) Filed: Dec. 5, 2019

(65) Prior Publication Data
US 2020/0144524 A1    May 7, 2020

Related U.S. Application Data

(62) Division of application No. 14/871,370, filed on Sep. 30, 2015, now abandoned.
(Continued)

(51) Int. Cl.
*H01L 31/044* (2014.01)
*H01L 51/42* (2006.01)
(Continued)

(52) U.S. Cl.
CPC ........ *H01L 51/426* (2013.01); *H01L 31/0352* (2013.01); *H01L 51/0036* (2013.01);
(Continued)

(58) Field of Classification Search
CPC .................. H01L 31/00–078; Y02E 10/50–60
(Continued)

(56) References Cited

U.S. PATENT DOCUMENTS

2008/0092953 A1*   4/2008   Lee ...................... H01L 31/074
                                                                136/261
2009/0183769 A1    7/2009   Wang et al.
(Continued)

FOREIGN PATENT DOCUMENTS

JP        2014192306      * 10/2014
SG    WO2012112120      *  8/2012

OTHER PUBLICATIONS

JP2014192306 English translation (Year: 2014).*
(Continued)

*Primary Examiner* — Bach T Dinh
(74) *Attorney, Agent, or Firm* — Terry M. Sanks, Esq.; Beusse Sanks, PLLC

(57) ABSTRACT

A photovoltaic cell includes a substrate layer, an anode layer on the substrate layer, an active layer on the anode layer, and a cathode layer on the active layer, wherein the active layer comprises a plurality of disparately sized n-type and p-type nano-particles of different semiconductor materials randomly distributed in a conductive polymer blend. The n-type nano-particles can include either ZnO or $In_2O_3$ nano-particles, and the p-type nano-particles can include either NiO or $La_2O_3$ nano-particles. The conductive polymer blend can include P3HT. The bandgaps of the nano-particles have corresponding energies ranging from the near ultraviolet to the far infrared.

20 Claims, 9 Drawing Sheets
(9 of 9 Drawing Sheet(s) Filed in Color)

Related U.S. Application Data

(60) Provisional application No. 62/059,595, filed on Oct. 3, 2014.

(51) Int. Cl.
    *H01L 51/00*         (2006.01)
    *H01L 31/0352*     (2006.01)

(52) U.S. Cl.
    CPC ......... *H01L 51/0097* (2013.01); *Y02E 10/549* (2013.01); *Y02P 70/50* (2015.11)

(58) Field of Classification Search
    USPC .................................................. 136/243–265
    See application file for complete search history.

(56) References Cited

U.S. PATENT DOCUMENTS

| | | | | |
|---|---|---|---|---|
| 2009/0266418 | A1* | 10/2009 | Hu | H01L 51/0014 136/260 |
| 2010/0051092 | A1* | 3/2010 | Dumitru | B82Y 30/00 136/255 |
| 2010/0139744 | A1 | 6/2010 | Rogojina et al. | |
| 2010/0139772 | A1* | 6/2010 | Frank | H01G 9/2031 136/261 |
| 2011/0281070 | A1 | 11/2011 | Mittal et al. | |
| 2011/0297217 | A1* | 12/2011 | Barkhouse | H01L 51/42 136/255 |
| 2012/0138140 | A1 | 6/2012 | Kihara et al. | |
| 2013/0061931 | A1 | 3/2013 | Lim et al. | |
| 2013/0230942 | A1 | 9/2013 | Nalwa et al. | |
| 2015/0194603 | A1 | 7/2015 | Chiu et al. | |
| 2018/0158971 | A1* | 6/2018 | Kim | H01L 21/02576 |

OTHER PUBLICATIONS

Hansson, R. (2011). Abstract of NiO nanoparticles in P3HT:PCBM Bulk Heterojunction Solar Cells (Dissertation). Retrieved from http://urn.kb.se/resolve?um=um:nbn:se:kau:diva-7978 (Year: 2011).

Zhang et al. "Electrospun Nanofibers of p-Type NiO/n-Type ZnO Heterojunctions with Enhanced Photocatalytic Activity." ACS Applied Materials & Interfaces, vol. 2, No. 10, pp. 2915-2923, Oct. 11, 2010 (Year: 2010).

Das et al. "Hybrid photovoltaic devices from regioregular polythiophene and ZnO nanoparticles composites." Renewable Energy 35 (2010) 2683-2688.

Non-Final Office Action dated Jun. 25, 2019, corresponding to U.S. Appl. No. 14/871,370.

Final Office Artion dated Mar. 4, 2019, corresponding to Application No. 14/871,370.

Non-Final Office Action dated Jul. 23, 2018, corresponding to U.S. Appl. No. 14/871,370.

Final Office Action dated Nov. 3, 2017, corresponding to U.S. Appl. No. 14/871,370.

Non-Final Office Action dated Feb. 10, 2017, corresponding to U.S. Appl. No. 14/871,370.

\* cited by examiner

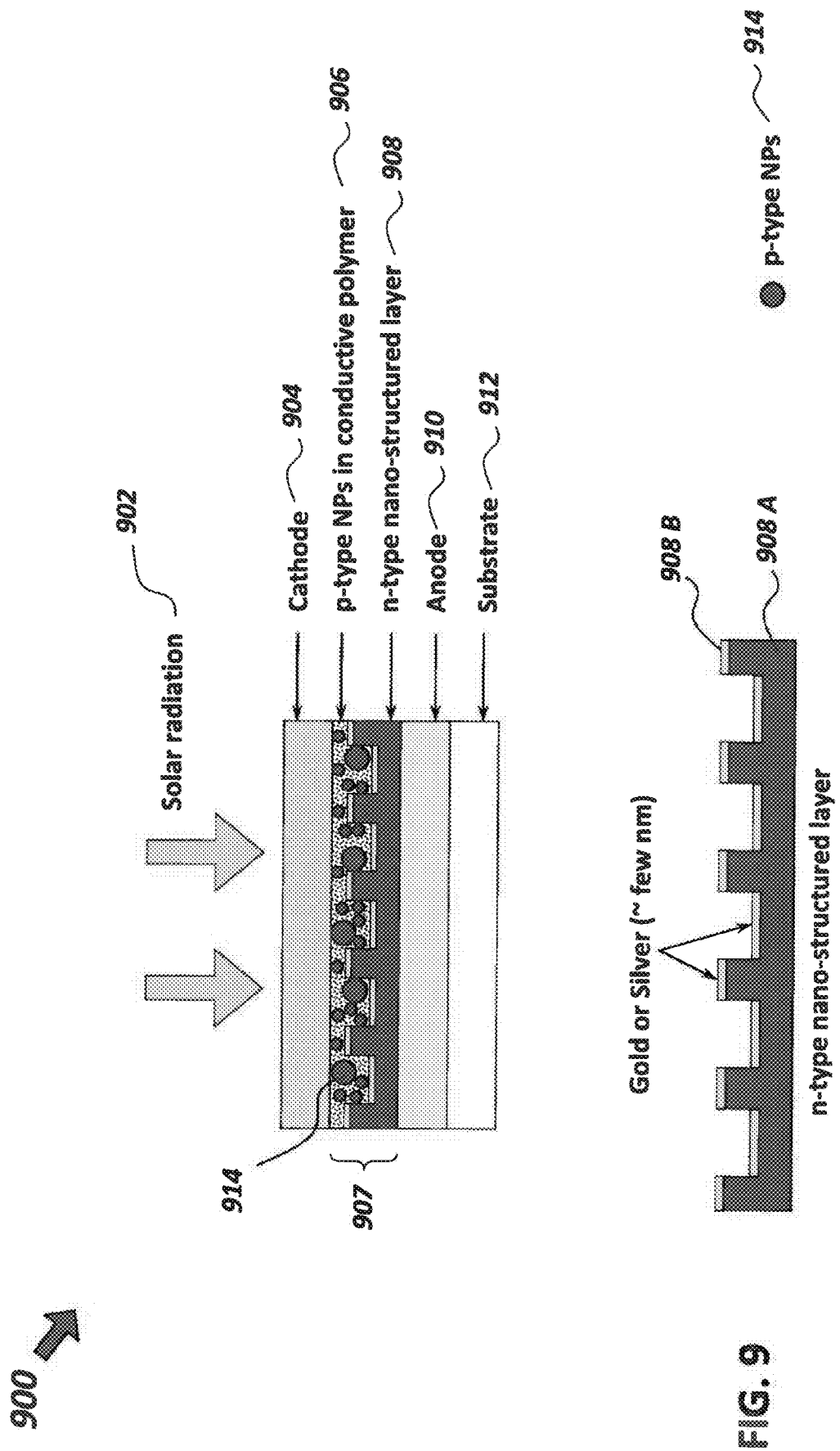

PHOTOVOLTAIC CELLS BASED ON DONOR AND ACCEPTOR NANO-PARTICULATE CONJUGATES IN CONDUCTIVE POLYMER BLENDS

RELATED APPLICATIONS

This application is a divisional application of U.S. application Ser. No. 14/871,370 filed on Sep. 30, 2015, which claims priority to U.S. Provisional Application 62/059,595, filed on Oct. 3, 2014, the contents of which are herein incorporated by reference in its entirety.

GOVERNMENT LICENSE RIGHTS

This invention was made with government support under W911NF-11-1-0214 awarded by The Department of the Army. The government has certain rights in the invention.

FIELD OF THE INVENTION

The present invention relates to photovoltaic cells and more particularly to photovoltaic cells that use n-type and p-type nano-particles suspended in an active layer.

BACKGROUND OF THE INVENTION

Today there is significant interest in renewable and environmentally friendly energy resources. Photovoltaic and other solar cell technologies are of particular interest and deemed to be important for present and future energy needs and applications. Crystalline silicon (Si) solar cells are the most prevalent today given the current state of the art. Crystalline silicon solar cells are based on the formation of a junction between n-type and p-type materials, wherein, as is known in the art, n-type materials have electrons as the majority carries and p-type materials have holes as the majority carriers.

Referring now to FIG. 1, a typical crystalline silicon solar cell system 100 is shown. An array of solar cells 102 is exposed to sunlight 104, and generates a current 106 that drives a load 108. Each of the solar cells 102 includes a layer of n-type silicon and a layer of p-type silicon, forming a junction there between. The layered structure of a solar cell 102 is shown in greater detail in solar cell portion 110, where the individual electrons and holes are shown.

Referring now to FIG. 2, a graph 200 of solar light energy versus its wavelength is shown, which illustrates the limitations of present crystalline silicon solar cell technology. The solar spectrum 202 is shown, illustrating the various peaks and valleys associated with the light spectrum received from the sun. The solar spectrum received is also referred to as AM1.5. The energy spectrum 204 converted by the crystalline silicon solar cell is also shown. Note that spectrum 204 has a much lower energy amplitude and bandwidth than the input solar spectrum 202. Thus, the typical silicon solar cell has a limited solar absorption range. Furthermore, silicon solar cells are structurally rigid and therefore not feasible for large area applications.

To address the deficiencies found in the silicon crystalline solar cell approach, multi-junction approaches have been tried. Typically such multi-junction solar cells are based on multiple junctions formed by III-V compound semiconductor materials. While these solar cells extended solar absorption as compared to crystalline silicon solar cells, they still do not fully exploit the blue shift in the solar spectrum as is shown with respect to FIG. 3.

Referring now to FIG. 3, the solar spectrum 302 and the converted spectrum 304, 306, and 308 of a multi-junction solar cell are shown. Converted spectrum 304 shows the portion of the spectrum converted by an Indium Gallium Phosphide (InGaP) top cell, converted spectrum 306 shows the portion of the spectrum converted by an Indium Gallium Arsenide (InGaAs) middle cell, and converted spectrum 308 shows the portion of the spectrum converted by a Germanium (Ge) bottom cell. The structure of the multi-junction solar cell is described below with respect to FIG. 4.

Referring now to FIG. 4 a multi-junction solar cell 400 is shown including top and bottom metallic contacts 402 and 436. The overall structure of the solar cell 400 includes a top cell coupled to the top metallic contact layer, a middle cell coupled to the top cell through a first tunnel junction, and a bottom cell coupled to the bottom metallic contact layer and to the middle cell through a second tunnel junction. From top to bottom, multi-junction solar cell 400 includes a top metallic contact layer 402, an anti-reflective coating 404 and a GaAs layer 406. The top cell includes an aluminum indium phosphide (AlInP) window layer 408, an InGaP emitter layer 410, an InGaP base layer 412, and an aluminum gallium indium phosphide (AlGaInP) back surface field layer 414 in communication with the first tunnel junction layer 416. The middle cell includes an InGaP window layer 418, an InGaAs emitter layer 420, an InGaAs base layer 422, and an InGaP back surface field layer 424 in communication with the second tunnel junction layer 426. The bottom cell includes an InGaAs buffer layer 428, an InGaP hereto layer 430, a Ge base layer 432, and a Ge back surface field layer 434 in communication with the bottom metallic contact layer 436.

While the multi-junction solar cell of the type described above is an improvement over the typical crystalline silicon solar cell, it still does not fully exploit the blue shift in the solar spectrum and is prohibitively expensive to manufacture. Thus multi-junction solar cells are primarily restricted to space applications. Further, multi-junction solar cells of the type described above are structurally rigid and not feasible for use in wide area applications.

What is desired, therefore, is a solar cell that can take advantage of even more of the available solar spectrum, can be economically manufactured, and has the possibility of being manufactured in a flexible embodiment for use in various applications not possible for a structurally rigid solar cell.

SUMMARY OF THE INVENTION

According to an embodiment of the present invention, a photovoltaic cell includes a substrate layer, an anode layer on the substrate layer, an active layer on the anode layer, and a cathode layer on the active layer, wherein the active layer comprises a plurality of disparately sized n-type and p-type nano-particles of different semiconductor materials randomly distributed in a conductive polymer blend. The n-type nano-particles can include either zinc oxide (ZnO) or indium (III) oxide ($In_2O_3$) nano-particles, and the p-type nano-particles can include either nickel (II) oxide (NiO) or lanthanum oxide ($La_2O_3$) nano-particles. The conductive polymer blend can include poly(3-hexyl)thiophene, known as P3HT. The bandgaps of the nano-particles have corresponding energies ranging from the near ultraviolet to the far infrared. The nano-particles respond to different wavelengths, and thereby different parts of the spectrum. The photovoltaic cell according to the present invention can comprise a flexible photovoltaic cell wherein the substrate layer comprises a flexible layer made of polymer or any other appropriate material. The anode layer can include indium tin oxide (ITO), and the cathode layer can include gold or aluminum. An interfacial layer can be interposed between the active layer and the cathode layer, wherein the interfacial layer can include a plurality of gold nano-particles in a conductive polymer. The conductive polymer can include poly(3,4-ethylenedioxythiophene)-poly(styrenesulfonate), known as PEDOT: PSS. The interfacial layer can also be interposed between the active layer and the anode layer, wherein the interfacial layer can include a plurality of titanium dioxide ($TiO_2$) nano-particles in a conductive polymer. The conductive polymer for this interfacial layer can also include PEDOT: PSS. The photovoltaic cell of the present invention can also include gold or silver nano-particles.

According to another embodiment of the present invention, a photovoltaic cell includes a substrate layer, an anode layer on the substrate layer, an n-type nano-structured layer on the anode layer, an active layer on the anode layer, and a cathode layer on the active layer, wherein the active layer comprises a plurality of disparately sized p-type nano-particles of different semiconductor materials randomly distributed in a conductive polymer blend. The n-type nano-structured layer can include nano-imprinted $TiO_2$ or ZnO putty, and the n-type nano-structured layer can further include a gold or silver layer.

According to another embodiment of the present invention, a method of manufacturing a photovoltaic cell includes providing a substrate layer, forming an anode layer on the substrate layer, forming an active layer on the anode layer, and forming a cathode layer on the active layer, wherein the active layer comprises a plurality of disparately sized n-type and p-type nano-particles of different semiconductor materials randomly distributed in a conductive polymer blend.

According to another embodiment of the present invention, a method of manufacturing a photovoltaic cell includes providing a substrate layer, providing an anode layer on the substrate layer, providing an n-type nano-structured layer on the anode layer, providing an active layer on the anode layer, and providing a cathode layer on the active layer, wherein the active layer comprises a plurality of disparately sized p-type nano-particles of different semiconductor materials randomly distributed in a conductive polymer blend.

BRIEF DESCRIPTION OF THE DRAWINGS

The patent of application file contains at least one drawing executed in color. Copies of this patent or patent application publication with color drawing(s) will be provided by the Office upon request and payment of the necessary fee.

FIGS. 6, 7, 8 and 9 are cross-sectional views of solar cells according to other embodiments of the present invention.

DETAILED DESCRIPTION

Figure 1:
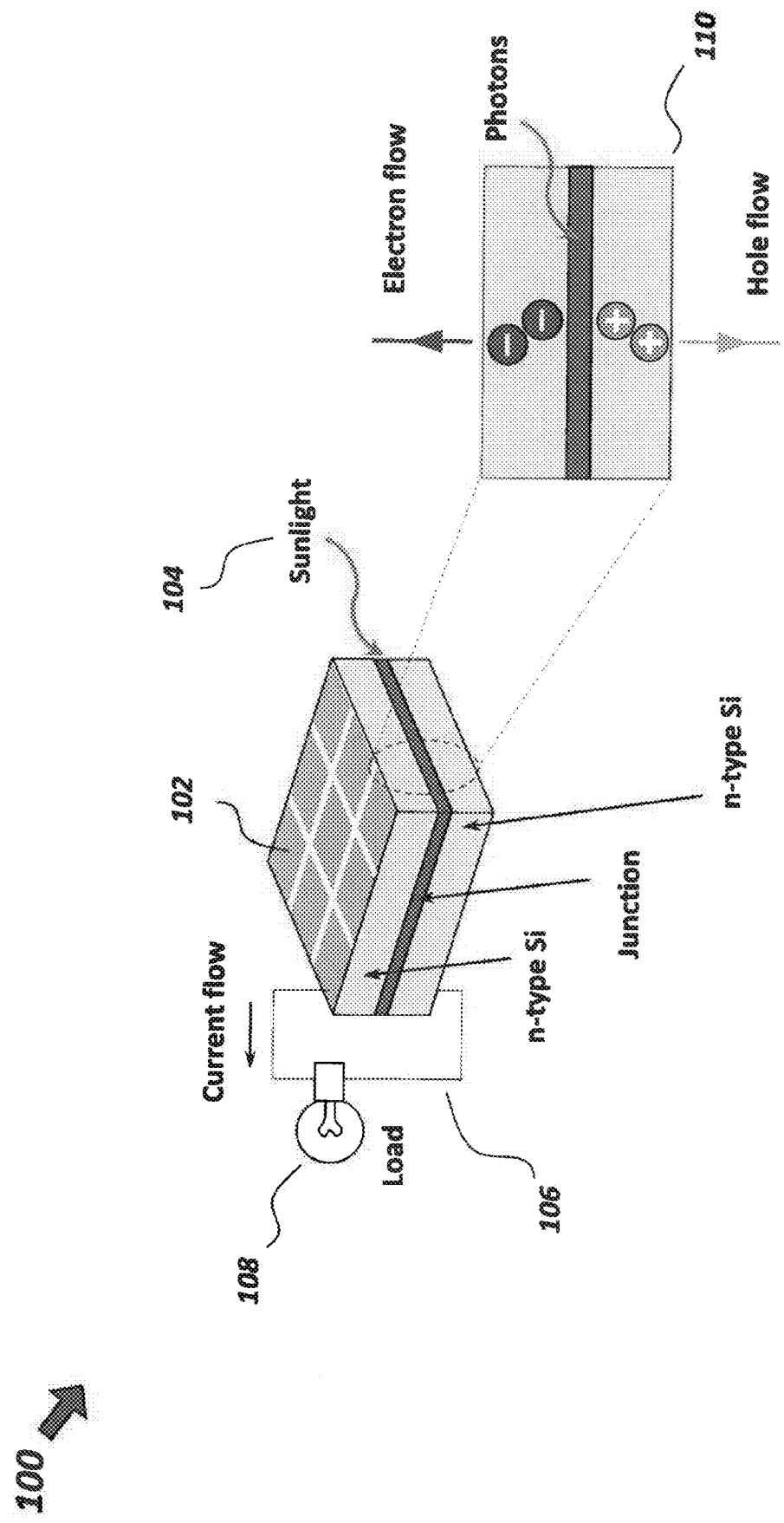
FIG. 1 is a silicon crystalline solar cell system according to the prior art.
Figure 2:
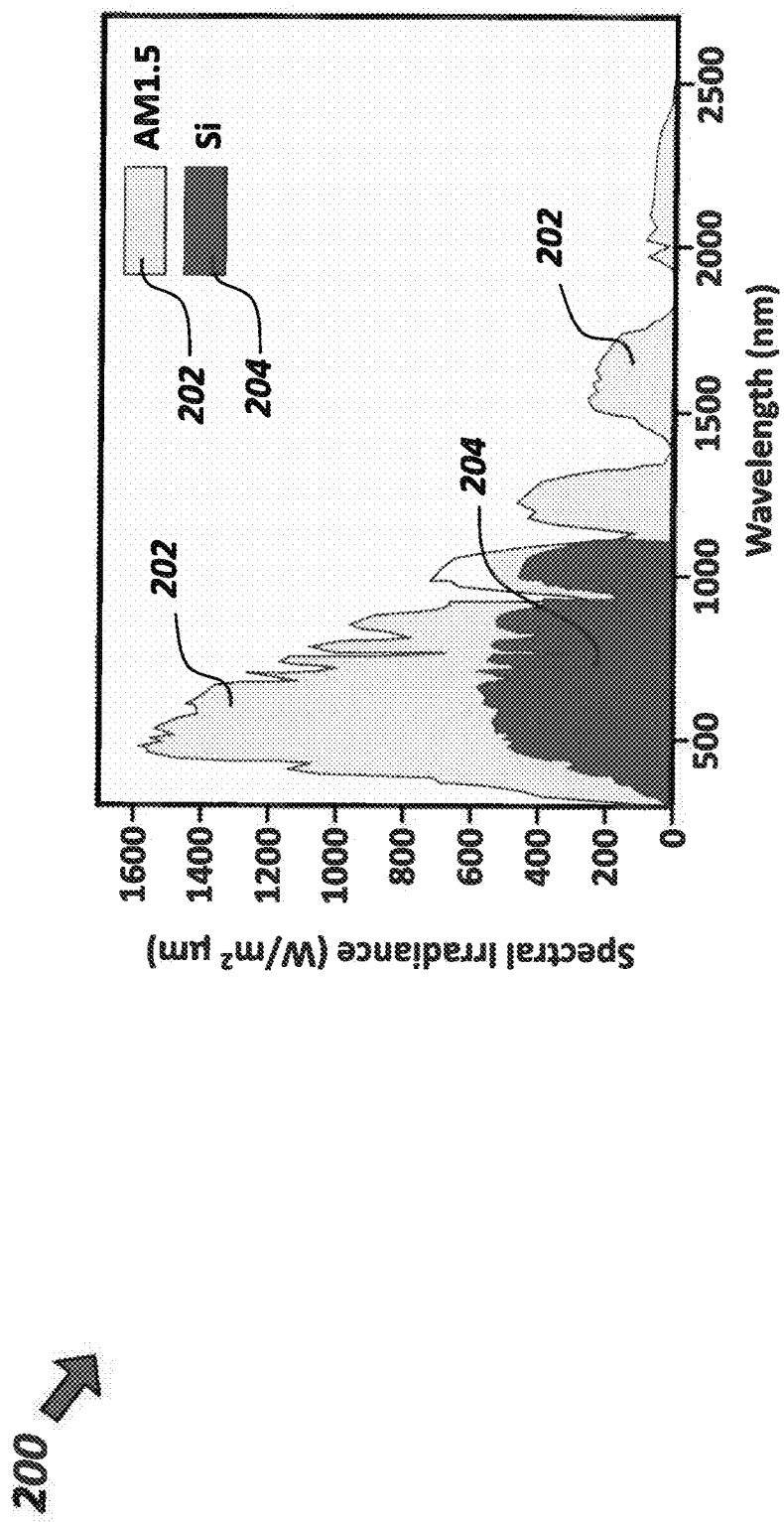
FIG. 2 is a graph of the solar energy spectrum converted by a silicon crystalline solar cell according to the prior art.
Figure 3:
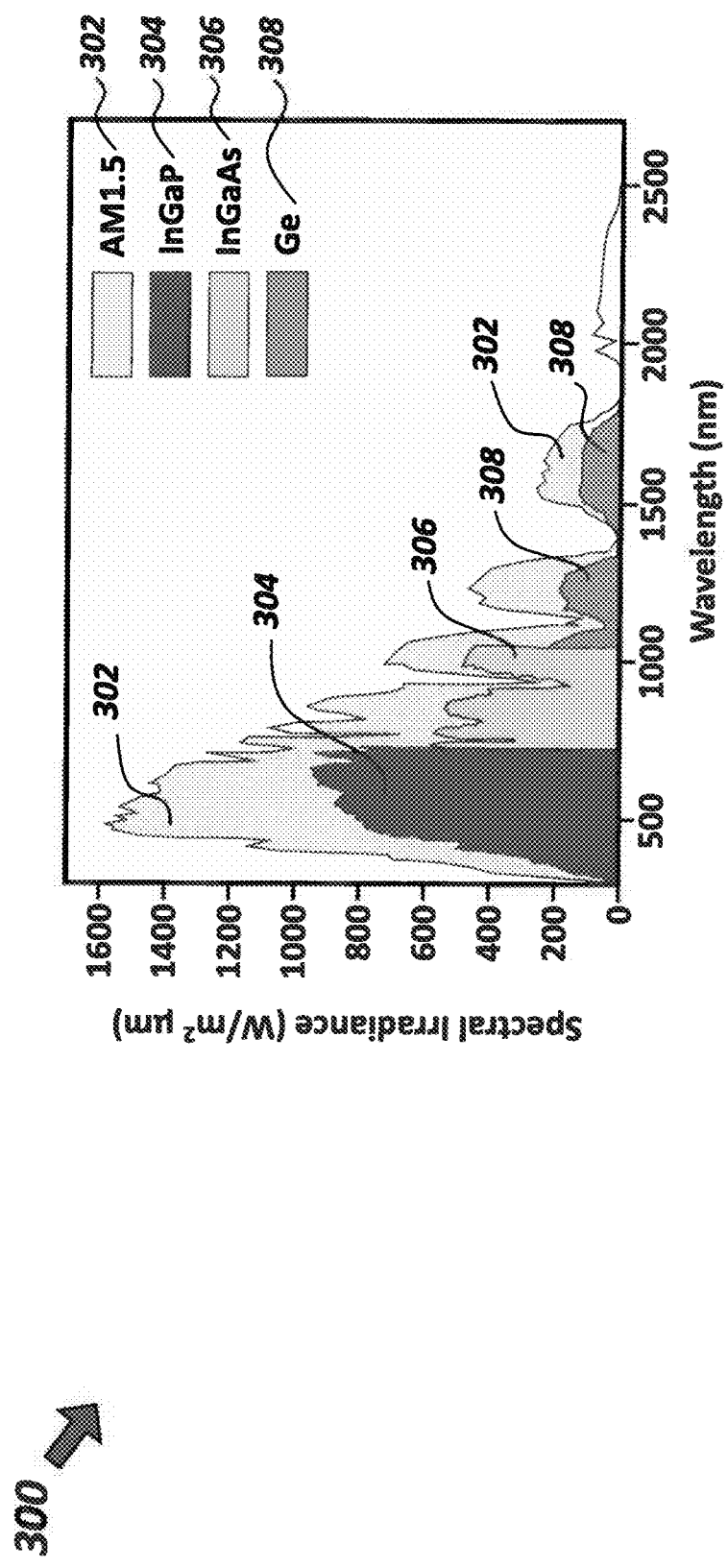
FIG. 3 is a graph of the solar energy spectrum converted by a multi-junction solar cell according to the prior art.
Figure 4:
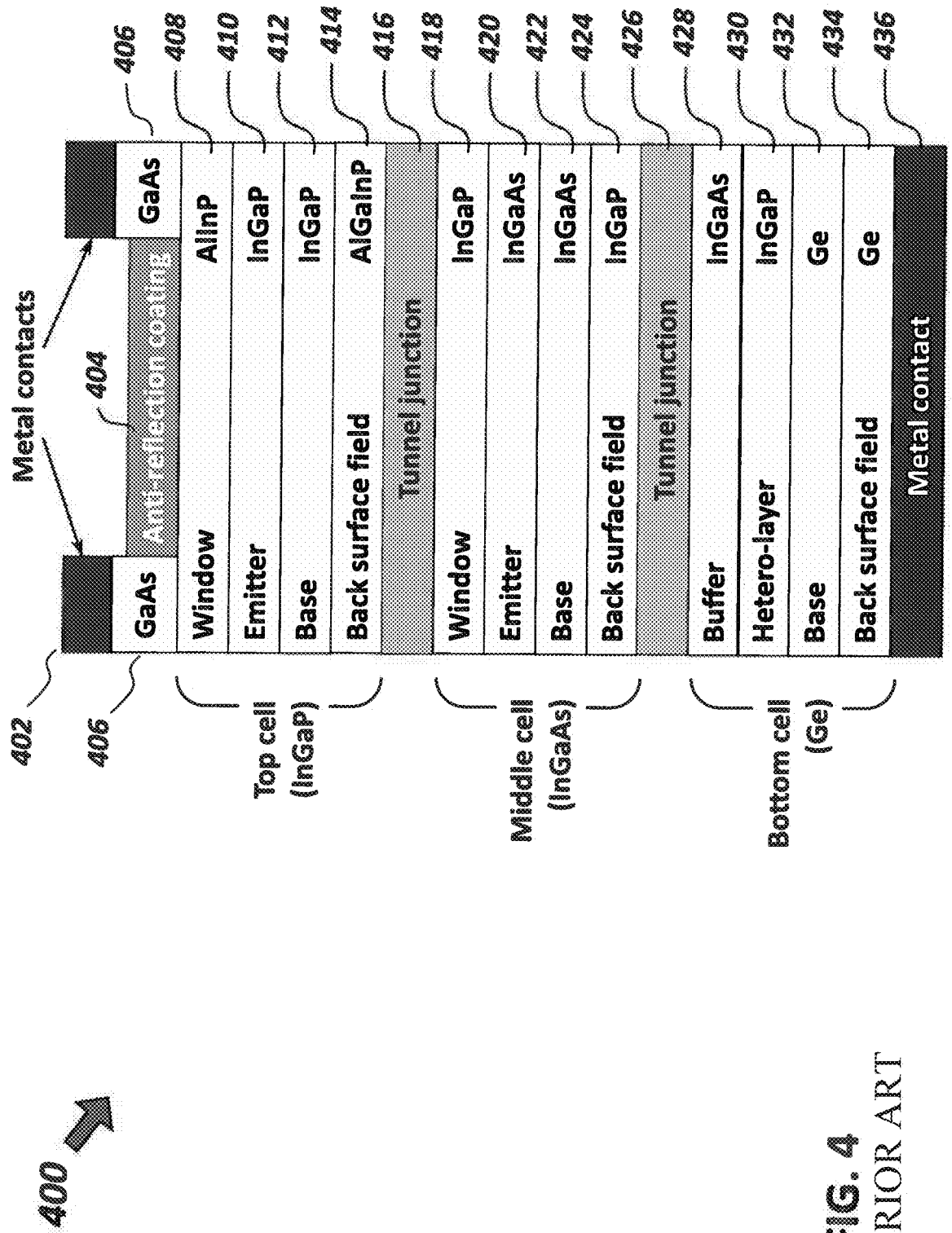
FIG. 4 is a cross-sectional view of a multi-junction solar cell according to the prior art.
Figure 5:
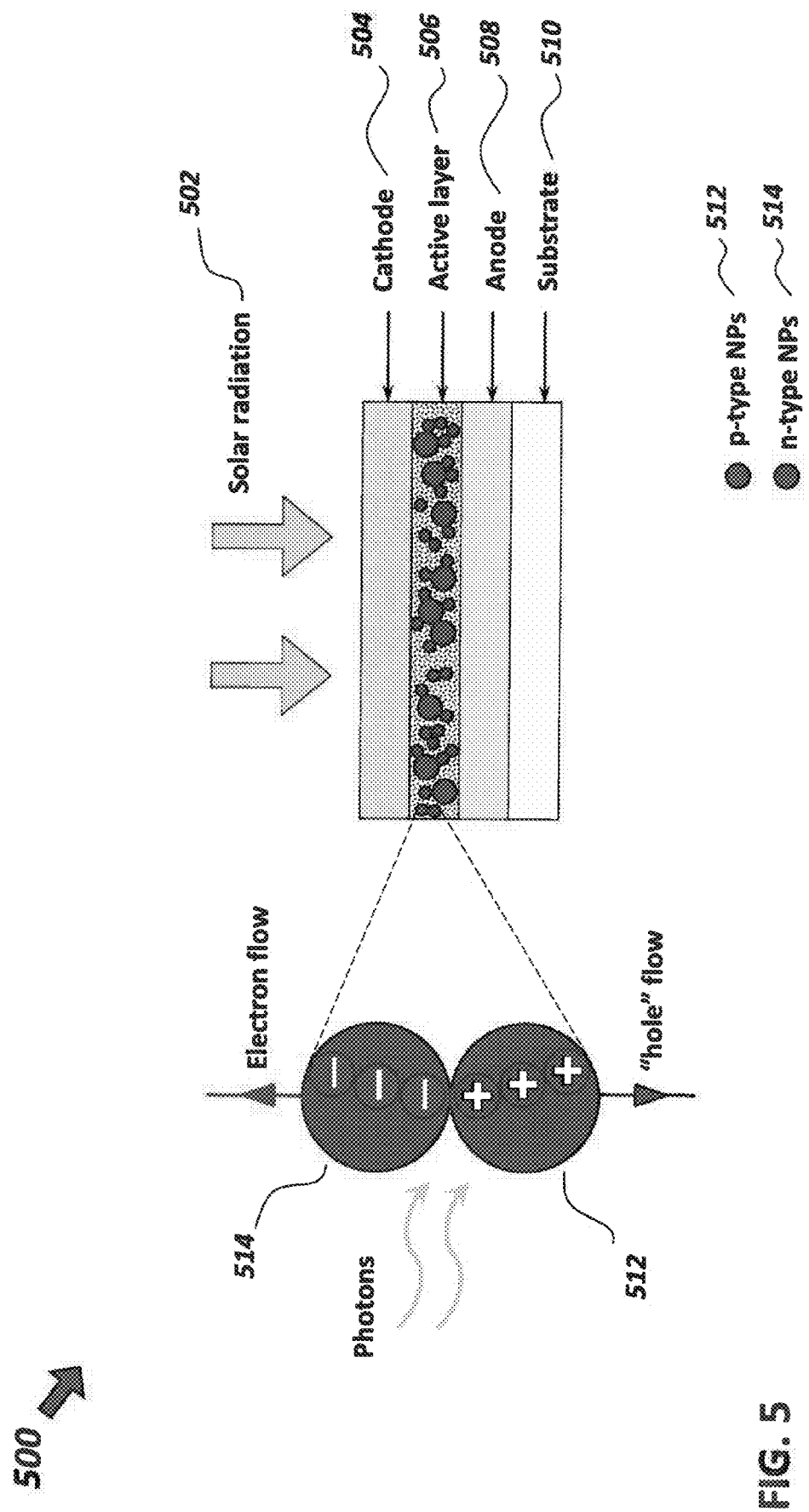
FIG. 5 is a cross-sectional view of a solar cell according to an embodiment of the present invention.

Referring now to FIG. 5, according to an embodiment of the present invention, a photovoltaic cell 500 receiving solar radiation 502 includes a substrate layer 510, an anode layer 508 on the substrate layer, an active layer 506 on the anode layer, and a cathode layer 504 on the active layer, wherein the active layer 506 comprises a plurality of disparately sized n-type and p-type nano-particles 514, 512 of different semiconductor materials randomly distributed in a conductive polymer blend. The n-type nano-particles 514 can include either ZnO or $In_2O_3$ nano-particles, and the p-type nano-particles 512 can include either NiO or $La_2O_3$ nano-particles. The conductive polymer blend can include P3HT. The bandgaps of the nano-particles have corresponding energies ranging from the near ultraviolet to the far infrared. The photovoltaic cell according to the present invention can comprise a flexible photovoltaic cell wherein the substrate layer 510 comprises a layer of flexible material. The anode layer 508 can include ITO, and the cathode layer 504 can include silver or aluminum.

In FIG. 5, a close-up of the active layer 506 is shown showing photons received from the solar radiation 502, the electron flow associated with a single n-type nano-particle 514, and hole flow associated with a single p-type nano-particle 512.

As shown in FIG. 5 and described above, solar cell 500 makes use of disparately sized n-type and p-type nano-particles of different semiconductor materials. The semiconductor nano-particles are distributed randomly in an active layer 506 including conductive polymer blends. The nano-particles have bandgaps ranging from near ultraviolet to the far infrared as described above. The strategic distribution of noble metal nano-particles can also be made in the active layer, which is described in further detail below.

Some of the advantages of the solar cell 500 according to the present invention include the utilization of the entire solar spectrum (including the blue shift) in a single device structure that is relatively simple to manufacture and can thus be made economically. Solar cell 500 exhibits a high conversion efficiency, which can be improved by plasmonic enhancement from noble metal nano-particles that is described in further detail below. Many different embodiments and variations of the basic solar cell 500 shown in FIG. 5 are possible, some of which are shown and described in further detail below. The use of conductive polymers in the active layer and flexible materials in the substrate layer, as well as the use of nano-particle blends in the active layer allow structural flexibility. The solar cell 500 of the present can thus be used in applications not possible with the rigid crystalline silicon solar cells of the prior art.

Figure 6:
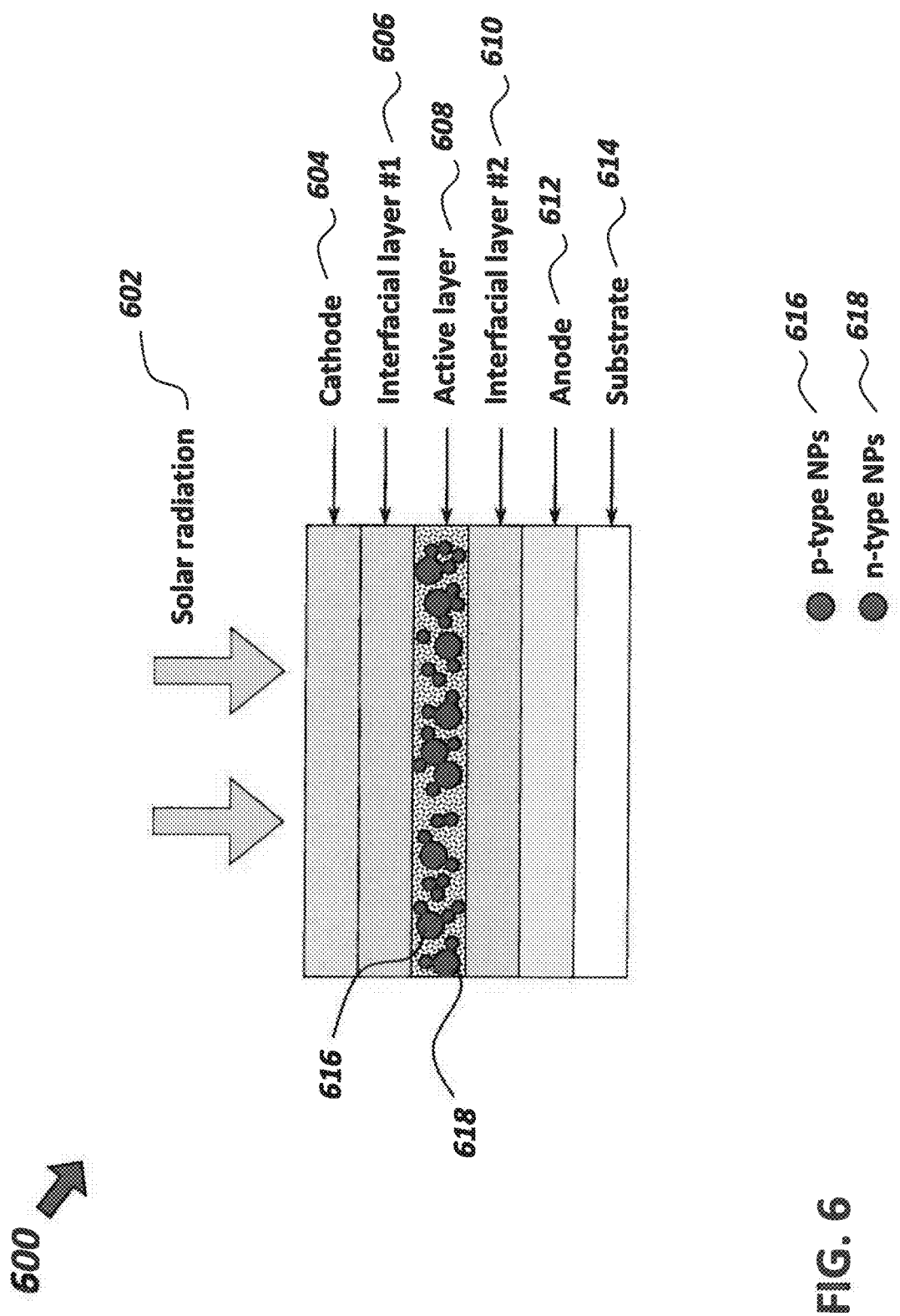
Figure 7:
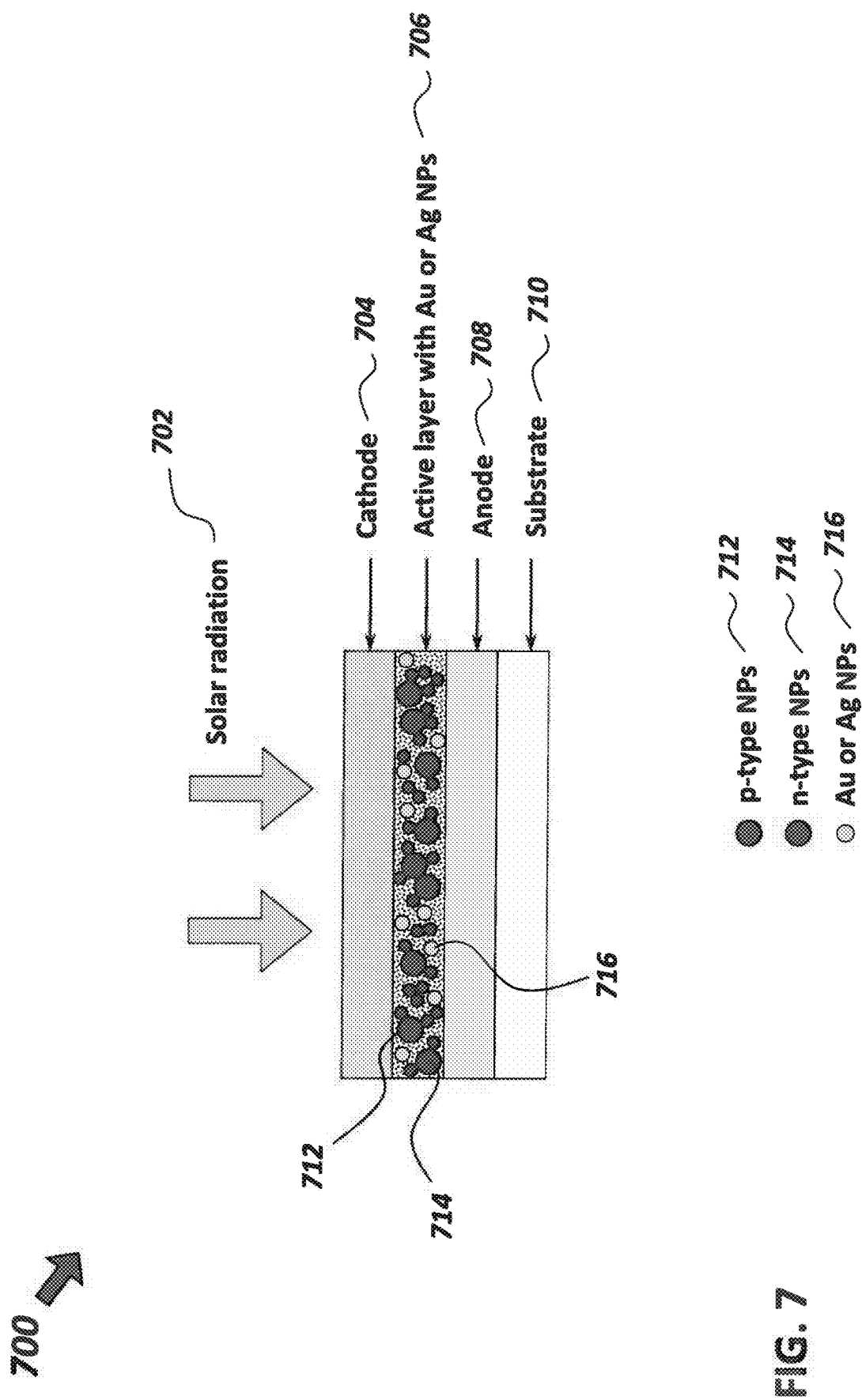

Another embodiment of the solar cell according to the present invention is shown in FIG. 6. Solar cell 600 receives solar radiation 602, and can include a first interfacial layer 606, a second interfacial layer 610, or both. The remaining structure of the solar cell is the same as that of solar cell 600 shown in FIG. 6. A first interfacial layer 606 can be interposed between the active layer 608 and the cathode layer 604, wherein the interfacial layer 606 can include a plurality of gold nano-particles in a conductive polymer. The conductive polymer can include PSS: PEDOT. A second interfacial layer 610 can also be interposed between the active layer 608 and the anode layer 612, wherein the interfacial layer can include a plurality of $TiO_2$ nano-particles in a conductive polymer. The conductive polymer for interfacial layer 610 can also include PSS: PEDOT. As noted above, solar cell includes the same p-type nano-particles 616 and n-type nano-particles 618 in the active layer 608. The n-type nano-particles can be ZnO or $In_2O_3$. The p-type nano-particles can be NiO or $La_2O_3$. The conductive polymer used in the active layer 608 can be P3HT. Similarly, the anode layer 612 is the same and can be made of ITO. The cathode layer 604 is the same and can be made of silver or aluminum.

Another embodiment of the photovoltaic cell of the present invention can also include gold or silver nano-particles. Solar cell 700 receives solar radiation 702 and includes a cathode layer 704, active layer 706 with gold or silver nano-particles 716, an anode layer 708, and a substrate layer 710. The active layer also includes p-type nano-particles 712 and n-type nano-particles 714 as previously described. Gold or silver nano-particles 716 are incorporated in the active layer 706 together with the n-type nano-particles 714 (ZnO, $In_2O_3$) and the p-type nano-particles 712 (NiO, $La_2O_3$). As previously described, the conductive polymer used in the active layer 706 can include P3HT. The incorporation of the gold or silver nano-particles create plasmonic enhancement, which yields an increase in efficiency of the solar cell.

Figure 8:
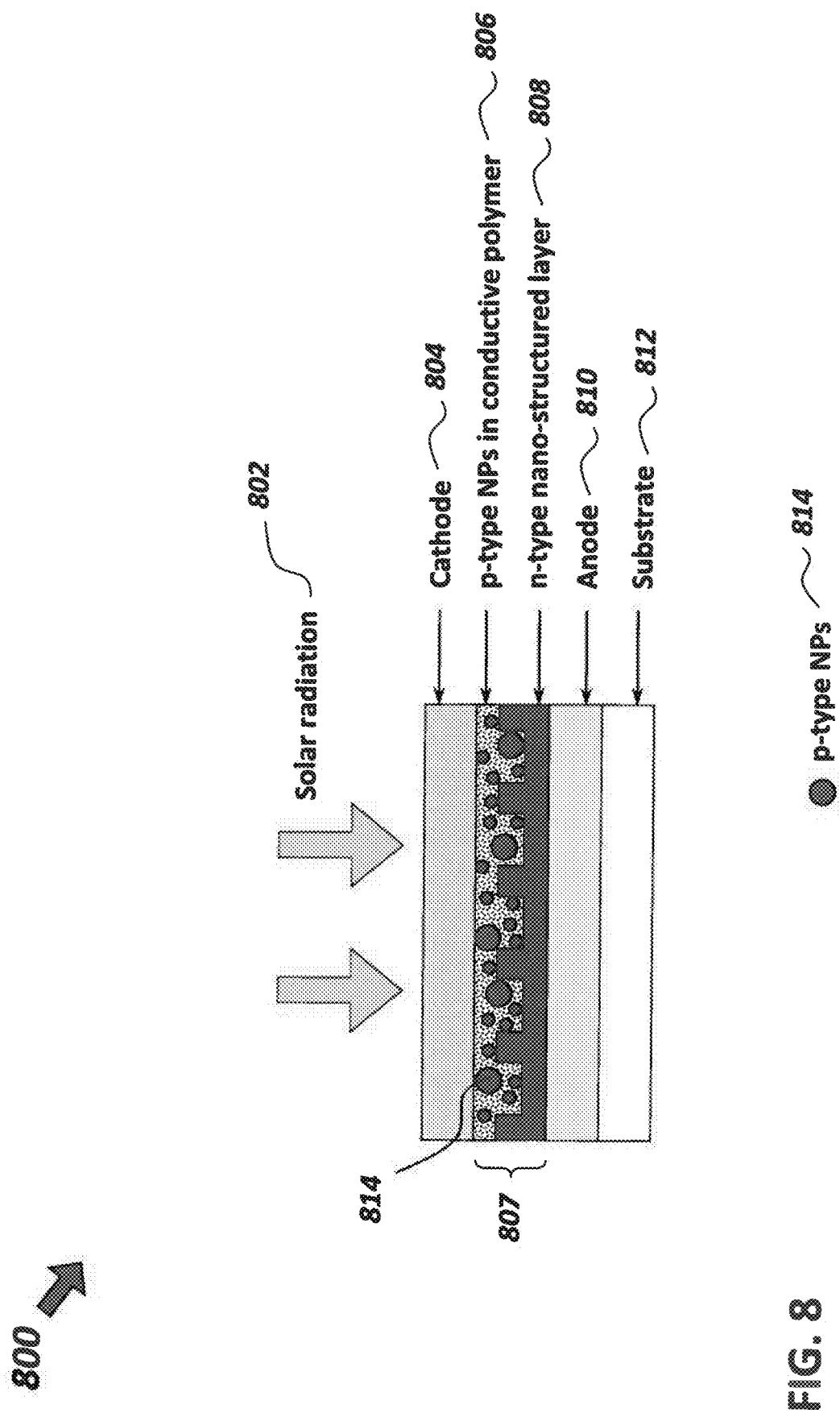

Another embodiment of the photovoltaic cell of present invention is shown in FIG. 8. Photovoltaic cell 800 receives solar radiation 802 and includes a substrate layer 812, an anode layer 810 on the substrate layer 812, an n-type nano-structured layer 808 on the anode layer, an active layer 807 on the anode layer 810, and a cathode layer 804 on the active layer 807, wherein the active layer 807 comprises a plurality of disparately sized p-type nano-particles 814 of different semiconductor materials randomly distributed in a conductive polymer blend 806. The n-type nano-structured layer 808 can include nano-imprinted $TiO_2$ or ZnO putty, and the n-type nano-structured layer 808 can further include a gold or silver layer coated on its surface. While a patterned n-type nano-structured layer 808 is shown in FIG. 8, it will be apparent to those of skill in the art that other nano-structured layers can be used. The dimensions of the nano-structures used in FIG. 8 is made comparable to or less than the electron and hole mobilities of the materials used, which addresses the inherently higher electrical resistivity of polymers.

Referring now to FIG. 9, an optional gold or silver layer 908B is shown with a thickness of a few nm over the previously described n-type nano-structured layer 908A without the optional gold or silver layer. Both of these layers taken together form the n-type nano-structured layer 908. Solar cell 900 thus receives solar radiation 902, and includes a cathode layer 904, p-type nano-particles in a conductive polymer 906, an n-type plated nano-structured layer 908, an anode layer 910, and a substrate 912. The active layer 907 includes layers 906 and 908. As previously described the n-type nano-structured layer 908 can include nano-imprinted $TiO_2$ or ZnO putty. The silver or gold nano-meter thick film 908B is sputtered on the nano-imprinted layer 908A. The gold or silver layer 908B provides plasmonic enhancement, which increases the efficiency of solar cell 900. The p-type nano-particles 914 are shown that are included in the polymer layer 906.

According to another embodiment of the present invention, a method of manufacturing a photovoltaic cell 500 shown in FIG. 5 includes providing a substrate layer 510, forming an anode layer 508 on the substrate layer 510, forming an active layer 506 on the anode layer 508, and forming a cathode layer 504 on the active layer 506, wherein the active layer 506 comprises a plurality of disparately sized n-type and p-type nano-particles of different semiconductor materials randomly distributed in a conductive polymer blend.

According to another embodiment of the present invention, a method of manufacturing a photovoltaic cell 800 shown in FIG. 8 includes providing a substrate layer 812, providing an anode layer 810 on the substrate layer 812, providing an n-type nano-structured layer 808 on the anode layer, providing an active layer 807 on the anode layer 810, and providing a cathode layer 804 on the active layer 807, wherein the active layer comprises a plurality of disparately sized p-type nano-particles of different semiconductor materials randomly distributed in a conductive polymer blend.

The invention claimed is:

1. A photovoltaic cell, comprising:
    a substrate layer;
    an anode layer on the substrate layer;
    an n-type nano-structured layer on the anode layer;
    an active layer on the n-type nano-structured layer; and
    a cathode layer on the active layer
    wherein the active layer comprises a plurality of disparately sized p-type nano-particles,
    wherein junctions randomly form between the n-type nano-structured layer and the disparately sized p-type nano-particles;
    wherein the n-type nano-structured layer comprises nano-structure rectangular ridges on the n-type nano-structured layer extending into the active layer, the ridges each having a face region facing the cathode and side regions facing adjacent ridges, and the n-type nano-structured layer having valley regions between the ridges; and
    further comprising gold or silver on the n-type nano-structured layer, the gold or silver being located on the face regions of the nano-structure rectangular ridges and in the valley regions of the n-type nano-structured layer, but not on the side regions of the nano-structure rectangular ridges, wherein the junctions randomly form between the side regions of the nano-structure rectangular ridges and the disparately sized p-type nano-particles.

2. The photovoltaic cell of claim 1, wherein n-type nano-particles comprise either ZnO or $In_2O_3$ nano-particles.

3. The photovoltaic cell of claim 1, wherein the p-type nano-particles comprise either NiO or $La_2O_3$ nano-particles.

4. The photovoltaic cell of claim 1, wherein the active layer further comprises a first conductive polymer comprising poly(3-hexyl)thiophene (P3HT).

5. The photovoltaic cell of claim 1, wherein:
    bandgaps of the n-type and p-type nano-particles both have corresponding energies ranging from the near ultraviolet to the far infrared.

6. The photovoltaic cell of claim 1, wherein the photovoltaic cell is flexible.

7. The photovoltaic cell of claim 1, wherein the substrate layer comprises a flexible layer.

8. The photovoltaic cell of claim 1, wherein the anode layer comprises indium tin oxide (ITO).

9. The photovoltaic cell of claim 1, wherein the cathode layer comprises gold or aluminum.

10. The photovoltaic cell of claim 1, wherein the active layer further comprises gold or silver nano-particles.

11. The photovoltaic cell of claim 1, wherein the active layer comprises a plurality of disparately sized n-type nano-particles.

12. The photovoltaic cell of claim 1, wherein the n-type nano-structured layer consists of a single material, and wherein the rectangular ridges have widths and heights equal to or less than the electron and hole mobility of the material.

13. The photovoltaic cell of claim 1, wherein the active layer further comprises gold or silver nano-particles.

14. A method of manufacturing a photovoltaic cell, the method comprising:
providing a substrate layer;
forming an anode layer on the substrate layer;
forming an n-type nano-structured layer on the anode layer;
forming an active layer on the n-type nano-structured layer; and
forming a cathode layer on the active layer,
wherein the active layer comprises a plurality of disparately sized p-type nano-particles randomly distributed in a first conductive polymer,
wherein junctions randomly form between the n-type nano-structured layer and the disparately sized p-type nano-particles;
wherein the n-type nano-structured layer comprises nano-structure rectangular ridges on the n-type nano-structured layer extending into the active layer, the ridges each having a face region facing the cathode and side regions facing adjacent ridges, and the n-type nano-structured layer having valley regions between the ridges; and
further comprising forming gold or silver on the n-type nano-structured layer, the gold or silver being located on the face regions of the nano-structure rectangular ridges and in the valley regions of the n-type nano-structured layer, but not on the side regions of the nano-structure rectangular ridges, wherein the junctions randomly form between the side regions of the nano-structure rectangular ridges and the disparately sized p-type nano-particles.

15. The method of claim 14, wherein the active layer further comprises a plurality of disparately sized n-type nano-particles.

16. The method of claim 14, wherein the active layer further comprises gold or silver nano-particles.

17. The photovoltaic cell of claim 1, further comprising a first interfacial layer interposed between the active layer and the cathode layer.

18. The photovoltaic cell of claim 17, further comprising a plurality of gold nano-particles in a conductive polymer of the interfacial layer.

19. The method of claim 14, further comprising forming a first interfacial layer between the active layer and the cathode layer.

20. The method of claim 14, wherein the interfacial layer comprises a plurality of gold nano-particles in a conductive polymer of the interfacial layer.

* * * * *